USOO5552728A

United States Patent [19]
Lin

[11] Patent Number: 5,552,728
[45] Date of Patent: Sep. 3, 1996

[54] LATCH-TYPE CURRENT SENSE AMPLIFIER WITH SELF-REGULATING INPUTS

[75] Inventor: Jyhfong Lin, Fremont, Calif.

[73] Assignee: Cirrus Logic, Inc., Fremont, Calif.

[21] Appl. No.: 432,962

[22] Filed: May 1, 1995

[51] Int. Cl.$^6$ .................................................. G01R 19/00
[52] U.S. Cl. .............................. 327/57; 327/51; 327/55
[58] Field of Search .................................. 327/51, 52, 55, 327/57; 365/189.01, 189.05, 203, 204, 205

[56] References Cited

U.S. PATENT DOCUMENTS

| | | | |
|---|---|---|---|
| 4,169,233 | 9/1979 | Haraszti | 327/57 |
| 4,321,492 | 3/1982 | Hollingsworth | 327/57 |
| 4,634,901 | 1/1987 | McElroy | 327/57 |
| 4,804,871 | 2/1989 | Walters, Jr. | 327/57 |
| 4,816,706 | 3/1989 | Dhong et al. | 327/57 |
| 5,258,946 | 11/1993 | Graf | 327/51 |
| 5,297,092 | 3/1994 | Johnson | 327/51 |

FOREIGN PATENT DOCUMENTS

| | | | |
|---|---|---|---|
| 6-164331 | 6/1994 | Japan | 327/57 |

OTHER PUBLICATIONS

Seno, et al, "A 9-ns 16-Mb CMOS SRAM with Offset--Compensated Current Sense Amplifier," *IEEE Journal of Solid–State Circuits*, vol. 28, No. 11 (Nov. 1993) pp. 1119–1124.
Lee, et al, "A 2.5 V CMOS Delay–Locked Loop for an 18 Mbit, 500 Megabyte/s DRAM," *IEEE Journal of Solid--State Circuits*, vol. 29, No. 12, (Dec. 1994) pp. 1491–1496.
Sasaki, et al, "A 7-ns 140-mW 1-Mb CMOS SRAM with Current Sense Amplifier," *IEEE Journal of Solid–State Circuits*, vol. 27, No. 11, (Nov. 1992) pp. 1511–1518.
Ishibashi, et al, "A 12.5-ns 16-Mb CMOS SRAM with Common–Centroid–Geometry–Layout Sense Amplifiers," *IEEE Journal of Solid–State Circuits*, vol. 29, No. 4 (Apr. 1994) pp. 411–418.
Yamauchi, et al, "A Circuit Technology for High–Speed Battery–Operated 16–Mb CMOS DRAM's," *IEEE Journal of Solid–State Circuits*, vol. 28, No. 11, (Nov. 1993) pp. 1084–1091.
Sekiyama, et al, "A 1-V Operating 256-kb Full–CMOS SRAM," *IEEE Journal of Solid–State Circuits*, vol. 27, No. 5, (May 1992) pp. 776–782.

(List continued on next page.)

*Primary Examiner*—Timothy P. Callahan
*Assistant Examiner*—Kenneth B. Wells
*Attorney, Agent, or Firm*—Majestic, Parsons, Siebert & Hsue

[57] ABSTRACT

A latch-type current sense amplifier circuit generates complementary latched data outputs indicative of a difference between first and second input currents provided to the sense amplifier circuit respectively via first and second input data lines. Included in the sense amplifier circuit are a latch circuit formed from cross-coupled inverters, a transmission gate responsive to a first control signal for equalizing the outputs of the sense amplifier circuit, and three transistors. The first transistor is responsive to a second control signal, activated after a delay after deactivation of the first control signal, for connecting a reference voltage to the latch circuit. The second transistor has a source connected to the first input data line, a drain connected to a first input of the latch circuit, and a gate connected to a second output of the latch circuit such that the second transistor is initially in a saturated conducting state immediately after deactivation of the first control signal and consequently, serves to reduce the effect of the high input impedance of the latch circuit. The third transistor has a source connected to the second input data line, a drain connected to a second input of the latch circuit, and a gate connected to a first output of the latch circuit such that the third transistor is also initially in a saturated conducting state immediately after deactivation of the first control signal and consequently, also serves to reduce the effect of the high input impedance of the latch circuit.

37 Claims, 9 Drawing Sheets

OTHER PUBLICATIONS

Blalock, et al, "A High–Speed Sensing Scheme for 1T Dynamic RAM's Utilizing the Clamped Bit–Line Sense Amplifier," *IEEE Journal of Solid–State Circuits*, vol. 27, No. 4, (Apr. 1992) pp. 618–625.

Aoki, et al, "A 1.5 DRAM for Battery–Based Applications," *IEEE Journal of Solid–State Circuits*, vol. 24, No. 5, (Oct. 1989) pp. 1206–1212.

Yoo, et al, "Variable $V_{CC}$ Design Techniques for Battery–Operated DRAM's," *IEEE Journal of Solid–State Circuits*, vol. 28, No. 4 (Apr. 1993) pp. 499–503.

Seki, et al, "A 6–ns 1–Mb CMOS SRAM with Latched Sense Amplifier," *IEEE Journal of Solid–State Circuits*, vol. 28, No. 4 (Apr. 1993) pp. 478–483.

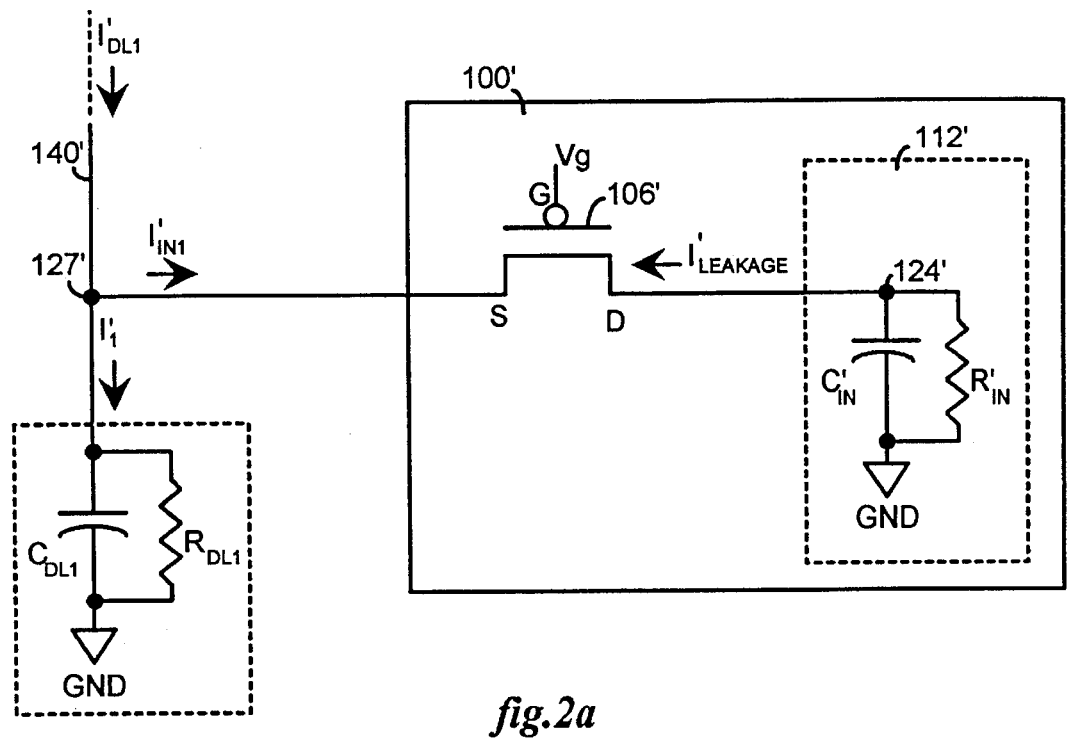
*fig.2a*
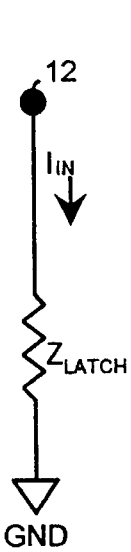
*fig.2b*
*prior art*
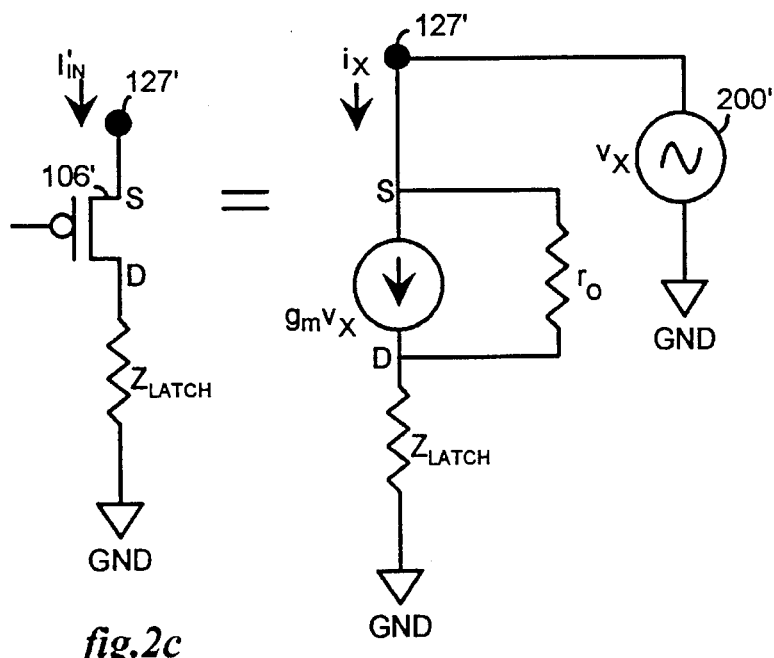
*fig.2c*  *fig.2d*

LATCH-TYPE CURRENT SENSE AMPLIFIER WITH SELF-REGULATING INPUTS

BACKGROUND OF THE INVENTION

This invention relates in general to sense amplifiers and in particular, to a latch-type current sense amplifier circuit which generates latched complementary logic level data outputs indicative of a difference between two input currents.

In applications where the data lines providing the input currents to a latch-type sense amplifier are heavily loaded, such as reading the stored states of individual memory cells in a high density memory array, very little of the current flowing through the data lines may flow into the sense amplifier. As a result, the sense amplifier may have a slow response and further, may generate false sensings due to noise in the system.

FIG. 1 illustrates, as an example, a simplified circuit model of one input side of a prior art latch-type sense amplifier circuit 10. The sense amplifier circuit 10 is connected at a node 12 to a heavily loaded data line 14, which is characterized at node 12 by an impedance $Z_{DL}$ including an accumulated capacitance $C_{DL}$ of the heavily loaded data line 14. The sense amplifier circuit 10 includes a latch circuit 16 having a latch input 18 connected to the data line 14 at node 12. The latch input 18 is characterized at node 12 by an input impedance $Z_{LATCH}$ including an input capacitance $C_{IN}$ of the latch circuit 16. Typically, the input capacitance $C_{IN}$ of the latch circuit 16 is much smaller than the accumulated capacitance $C_{DL}$ of the heavily loaded data line 14. Consequently, the impedance $Z_{DL}$ of the data line 14 at node 12 is generally much smaller than the input impedance $Z_{LATCH}$ of the latch circuit 16 at node 12. When a current $I_{DL}$ flows through the data line 14, it splits at node 12 into two currents. One current $I_{IN}$ flows into the sense amplifier circuit 10, and the other current $I_1$ continues to flow through the heavily loaded data line 14. Since the impedance $Z_{DL}$ of the data line 14 at node 12 is generally much smaller than the input impedance $Z_{LATCH}$ of the latch circuit 16 at node 12, the current $I_{IN}$ flowing into the sense amplifier circuit 10 is generally very small. As a consequence of the current $I_{IN}$ flowing into the sense amplifier circuit 10 being very small, the latch-type sense amplifier circuit 10 is slow in sensing and reacting to the current $I_{IN}$.

OBJECTS AND SUMMARY OF THE INVENTION

Accordingly, one object of the present invention is to provide a latch-type sense amplifier circuit which reliably generates latched logic level outputs from small currents flowing through data lines connected to the latch-type sense amplifier circuit.

Another object is to provide a high performance latch-type current sense amplifier circuit.

Still another object is to provide a low complexity, cost effective and easily manufacturable latch-type sense amplifier circuit.

These and additional objects are accomplished by the various aspects of the present invention, wherein briefly stated, one aspect is a latch-type current sense amplifier circuit characterized by a lower input impedance than certain conventional latch-type current sense amplifier circuits. As a consequence of such lower input impedance, the latch-type current sense amplifier circuit of the present invention receives proportionately more of the current flowing through input data lines connected to the latch-type current sense amplifier circuit than would such conventional latch-type current sense amplifier circuits if similarly connected. As a result, the latch-type current sense amplifier circuit of the present invention responds faster to currents flowing in the input data lines than would such similarly connected conventional latch-type current sense amplifier circuits.

Included in the current sense amplifier circuit are: a latching means having a first latch input characterized by a first latch input impedance, a second latch input characterized by a second latch input impedance, and a first latch output, for generating a latched data output at the first latch output in response to first and second signals respectively received at the first and second latch inputs; a first means connected between the first node and the first latch input, for receiving the first input current from the first input data line, generating the first signal from the first input current, and providing the first signal to the first latch input, wherein the first means in combination with the latching means is characterized at the first node by a first sense amplifier input impedance less than the first latch input impedance; and a second means connected between the second node and the second latch input, for receiving the second input current from the second input data line, generating the second signal from the second input current, and providing the second signal to the second latch input, wherein the second means in combination with the latching means is characterized at the second node by a second sense amplifier input impedance less than the second latch input impedance.

In its preferred embodiment, the latching means generates the latched data output at a first output of the latching means, and a latched complementary data output at a second output of the latching means. Preferably, also included in the current sense amplifier is an equalizing means responsive to a first control signal for equalizing voltages respectively on the first and second outputs of the latching means after the first control signal is activated. Preferably, the latching means responds to a second control signal activated after a time delay after the first control signal is deactivated, and generates the latched data output after the second control signal is activated. Preferably, the latching means includes cross-coupled first and second inverters responsive to the second control signal, wherein an output of the first inverter is connected to an input of the second inverter and an output of the second inverter is connected to an input of the first inverter, the inputs of the first and second inverters respectively receive the second and first input currents respectively passed by the second and first means, and the outputs of the first and second inverters respectively provide, after the second control signal is activated, the latched data output at the first output of the latching means and the latched complementary data output at the second output of the latching means. Preferably, the first means includes a first p-mos transistor having a source receiving the first input current, a drain connected to the input of the second inverter of the latching means, and a gate connected to the output of the second inverter of the latching means, and the second means includes a second p-mos transistor having a source receiving the second input current, a drain connected to the input of the first inverter of the latching means, and a gate connected to the output of the first inverter of the latching means.

Another aspect of the present invention is a latch-type current sense amplifier having self-regulating inputs. Included in the sense amplifier circuit are a latch circuit including cross-coupled first and second inverters, wherein an output of the first inverter is connected at a first node to an input of the second inverter, and an output of the second inverter is connected at a second node to an input of the first inverter; a first transistor having a source, a drain, and a gate, wherein the source receives the first input current, the drain is connected to the input of the second inverter, and the gate is connected to the output of the second inverter; and a second transistor having a source, a drain, and a gate, wherein the source receives the second input current, the drain is connected to the input of the first inverter, and the gate is connected to the output of the first inverter. Connected in such a fashion, preferably the first and second transistors are initially in a saturated conducting state when first sensing the difference between the first and second input currents, and an appropriate one of the first and second transistors is automatically turned off during generation of the latched data output by the current sense amplifier circuit.

Another aspect of the present invention is a method of generating a latched data output and a complementary latched data output indicative of a difference between first and second current inputs, comprising: equalizing, after a first control signal is activated, voltages respectively associated with first and second outputs of a latch circuit; deactivating the first control signal, and controllably passing the first and second current inputs respectively through first and second transistors initially in saturated conducting states; and generating, from the passed first and second current inputs, the latched data output at a first output of the latch circuit and the complementary latched data output at a second output of the latch circuit.

Another aspect of the present invention is a method of forming a current sense amplifier circuit for generating a latched data output and a complementary latched data output indicative of a difference between first and second current inputs, comprising: forming a latch by connecting an output of a first inverter to an input of a second inverter, and connecting an output of the second inverter to an input of the first inverter; connecting a source electrode of a first transistor to the first current input, connecting a drain electrode of the first transistor to the input of the second inverter, and connecting a gate electrode of the first to the output of the second inverter; and connecting a source electrode of a second transistor to the second current input, connecting a drain electrode of the second transistor to the input of the first inverter, and connecting a gate electrode of the second transistor to the output of the first inverter.

Another aspect of the present invention is a computer system including a microprocessor, a data bus connected to the microprocessor, and a sense amplifier circuit connected to the data bus. The sense amplifier circuit generates a latched data output indicative of a difference between first and second input currents respectively received from first and second input data lines respectively connected at first and second nodes to the sense amplifier circuit. Included in the sense amplifier circuit are: a latching means having a first latch input characterized by a first latch input impedance, and a second latch input characterized by a second latch input impedance, and a first latch output for generating the latched data output at the first latch output in response to first and second signals respectively received at the first and second latch inputs; a first means connected between the first node and the first latch input, for receiving the first input current, generating the first signal from the first input current, and providing the first signal to the first latch input, wherein the first means in combination with the latching means is characterized at the first node by a first sense amplifier input impedance less than the first latch input impedance; and a second means connected between the second node and the second latch input, for receiving the second input current, generating the second signal from the second input current, and providing the second signal to the second latch input, wherein the second means in combination with the latching means is characterized at the second node by a second input impedance less than the second latch input impedance.

Still another aspect of the present invention is a computer system including a microprocessor, a data bus connected to the microprocessor, and a latch-type sense amplifier circuit connected to the data bus. Included in the latch-type sense amplifier circuit are: a latch circuit including cross-coupled first and second inverters; a first transistor having a source, a drain, and a gate, wherein the source receives the first input current, the drain is connected to an input of the second inverter, and the gate is connected to an output of the second inverter; and a second transistor having a source, a drain, and a gate, wherein the source receives the second input current, the drain is connected to an input of the first inverter, and the gate is connected to an output of the first inverter.

Additional objects, features and advantages of the various aspects of the present invention will be apparent from the following description of its preferred embodiments, which description should be taken in conjunction with the accompanying drawings.

BRIEF DESCRIPTION OF THE DRAWINGS

FIG. 2a illustrates, as an example, a simplified circuit schematic modeling one input side of a latch-type current sense amplifier circuit utilizing aspects of the present invention;

FIG. 2b illustrates, as an example, the input impedance of the side of the prior art latch-type current sense amplifier circuit illustrated in FIG. 1;

FIG. 2c illustrates, as an example, the input impedance of the side of the latch-type current sense amplifier circuit, utilizing aspects of the present invention, illustrated in FIG. 2a;

FIG. 2d illustrates, as an example, a simplified small signal model of the input impedance of the side of the latch-type current sense amplifier circuit, utilizing aspects of the present invention, illustrated in FIG. 2a;

FIG. 5b illustrates, as examples, timing diagrams for the control signals $\Phi_1$, $\Phi'_3$, and $\Phi_2$ for controlling the latch-type current sense amplifier circuit of FIG. 5a;

DETAILED DESCRIPTION OF THE PREFERRED EMBODIMENT

Figure 1:
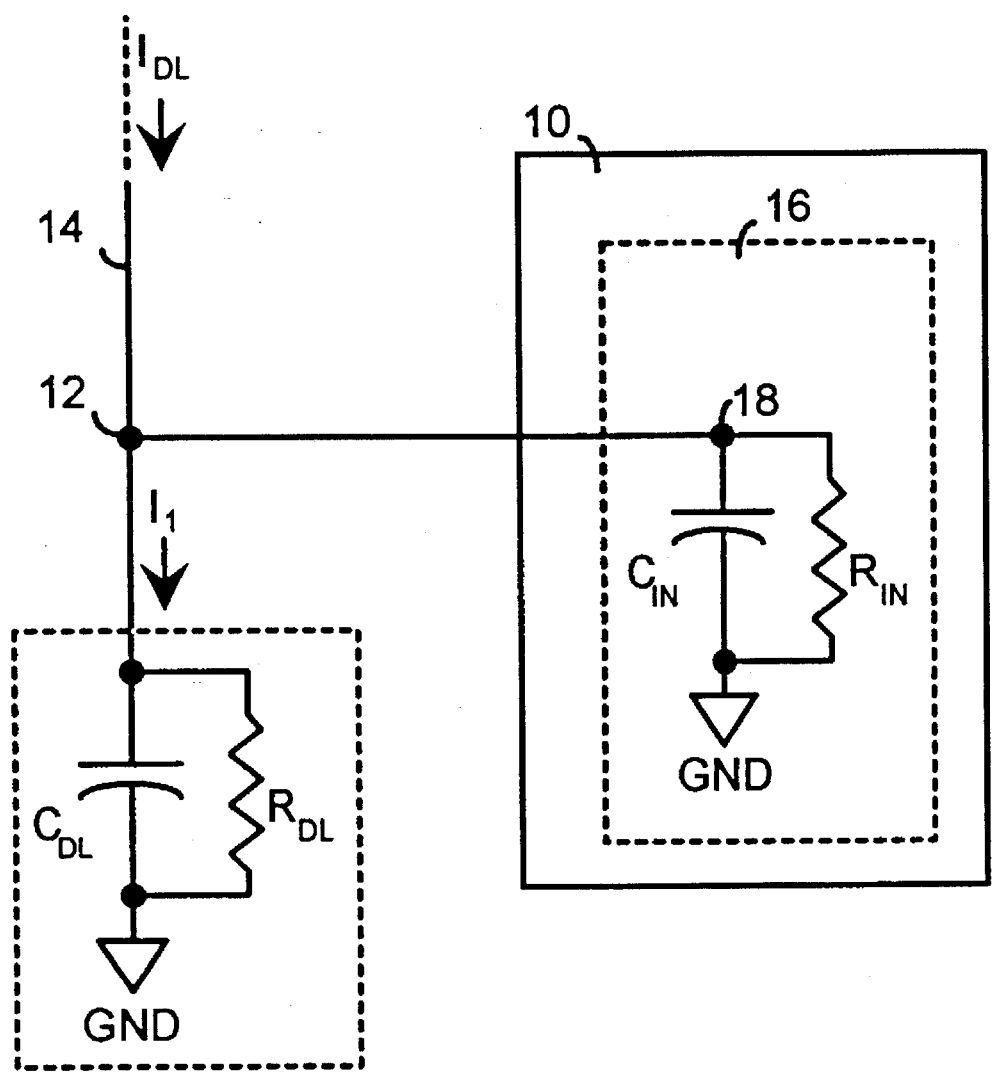
FIG. 1 illustrates, as an example, a simplified circuit schematic modeling one input side of a prior art latch-type current sense amplifier circuit.

Sense amplifier circuits are useful in a number of circuit applications. For example, they are particularly useful in memory reading circuitry for reading the programmed states of memory cells by sensing voltage or current differences between bit line pairs connected to individual memory cells. As another example, they are useful in comparator circuitry for comparing a voltage or current on a data line to another voltage or current by sensing the difference between two voltages or currents.

For high performance sense amplifier circuits, current sense amplifiers are advantageous since the differential currents that they sense lead their voltage counterparts by 90 degrees in phase. Accordingly, since the signals that they sense develop faster than those being sensed by voltage sense amplifier circuits, current sense amplifier circuits provide faster indications of data line differences than their voltage counterparts.

FIG. 2a illustrates, as an example, a simplified circuit model of an input side of a latch-type current sense amplifier circuit 100' utilizing aspects of the present invention. The latch-type current sense amplifier circuit 100' includes a latch circuit 112' of substantially identical construction as the latch circuit 16 of the latch-type sense amplifier circuit 10, and a p-mos transistor 106' connected between a heavily loaded data line 140' and the latch circuit 112'. The p-mos transistor 106' has a source connected to the heavily loaded data line 140' at node 127', a drain connected to an input node 124' of the latch circuit 112', and a gate connected to a voltage $V_g$. The voltage $V_g$ is of sufficient magnitude to ensure that the p-mos transistor 106' is in a saturated conducting state. As a consequence of the p-mos transistor 106' being in a saturated conducting state, the input impedance $Z_{IN}'$ of the latch-type sense amplifier circuit 100' at node 127' is significantly less than the input impedance $Z_{IN}$ of the prior art latch-type sense amplifier circuit 10 at its input node 12. In particular, the p-mos transistor 106' serves to minimize the effect of the high input impedance $Z_{LATCH}'$ of the latch circuit 112'. Since the input impedance $Z_{IN}'$ of the latch-type sense amplifier circuit 100' at node 127' is significantly less than the input impedance $Z_{LATCH}'$ of the latch circuit 112' and consequently, significantly less than the input impedance $Z_{LATCH}$ of the latch circuit 16 of the latch-type sense amplifier circuit 10, the current $I_{IN1}'$ flowing into the latch-type sense amplifier circuit 100' is significantly larger than the current $I_{IN}$ flowing into the prior art latch-type sense amplifier circuit 10. As a result, the latch-type sense amplifier circuit 100' is much faster in sensing and reacting to its input current $I_{IN1}'$ than the latch-type sense amplifier circuit 10 is in sensing and reacting to its smaller input current $I_{IN}$. Additionally, since the output impedance of the p-mos transistor 106' is very large when the p-mos transistor 106' is in a saturated conducting state, the p-mos transistor 106' effectively isolates the latch circuit 112' from the data line 140' such that any leakage current $I'_{LEAKAGE}$ resulting from charge stored on an input capacitance $C'_{IN}$ of the latch circuit 112' discharging back to the input data line 140' would be very small.

FIGS. 2b–d illustrate, as an example, how the p-mos transistor 106' operating in its saturated conducting state, effectively reduces the input impedance of the latch-type sense amplifier circuit 100', as compared with that of the prior art latch-type sense amplifier circuit 10. In FIG. 2b, the impedance looking into the prior art latch-type current sense amplifier circuit 10 at node 12 is depicted as the input impedance $Z_{LATCH}$ of the latch circuit 16. In FIG. 2c, the impedance looking into the latch-type current sense amplifier circuit 100' at node 127', is depicted as a combination of the saturated transistor 106' and the input impedance $Z_{LATCH}$ of the latch circuit 112'. In this case, the input impedances of the latch circuits 16 and 112' are both equal to $Z_{LATCH}$ since the two circuits are similarly constructed. In FIG. 2d, the saturated transistor 106' is replaced by its small signal model to facilitate computation of the input impedance $Z_{IN}$ of the latch-type sense amplifier circuit 100', resulting from the combination of the saturated transistor 106' and the input impedance $Z_{LATCH}$ of the latch circuit 112'.

Analyzing the simplified circuit schematic of FIG. 2d, it can be shown that the input impedance $Z_{IN}$ looking into node 127' is approximately equal to:

$$Z_{IN} = \frac{v_x}{i_x} \approx \frac{Z_{LATCH} + r_o}{1 + g_m r_o} \tag{1}$$

In the general case, where $g_m r_o \gg 1$, it can be shown that the input impedance $Z_{IN}$ looking into the node 127' is reduced (i.e., less than $Z_{LATCH}$) as long as $Z_{LATCH} > (1/g_m)$. In addition, where $Z_{LATCH} \gg r_o$, it can be shown that the input impedance $Z_{IN}$ looking into node 127' can be further approximated by:

$$Z_{IN} \approx \frac{Z_{LATCH}}{g_m r_o} \ll Z_{LATCH} \tag{2}$$

Accordingly, since the input impedance of the prior art latch-type sense amplifier circuit 10 is approximately equal to $Z_{LATCH}$, then the input impedance $Z_{IN}$ of of the latch-type sense amplifier circuit 100' is significantly less than the input impedance of the prior art latch-type sense amplifier circuit 10. As a consequence, the input current $I'_{IN}$ flowing into the latch-type sense amplifier circuit 100' is significantly higher than the input current $I_{IN}$ flowing into the prior art latch-type sense amplfier circuit 10.

Figure 3:
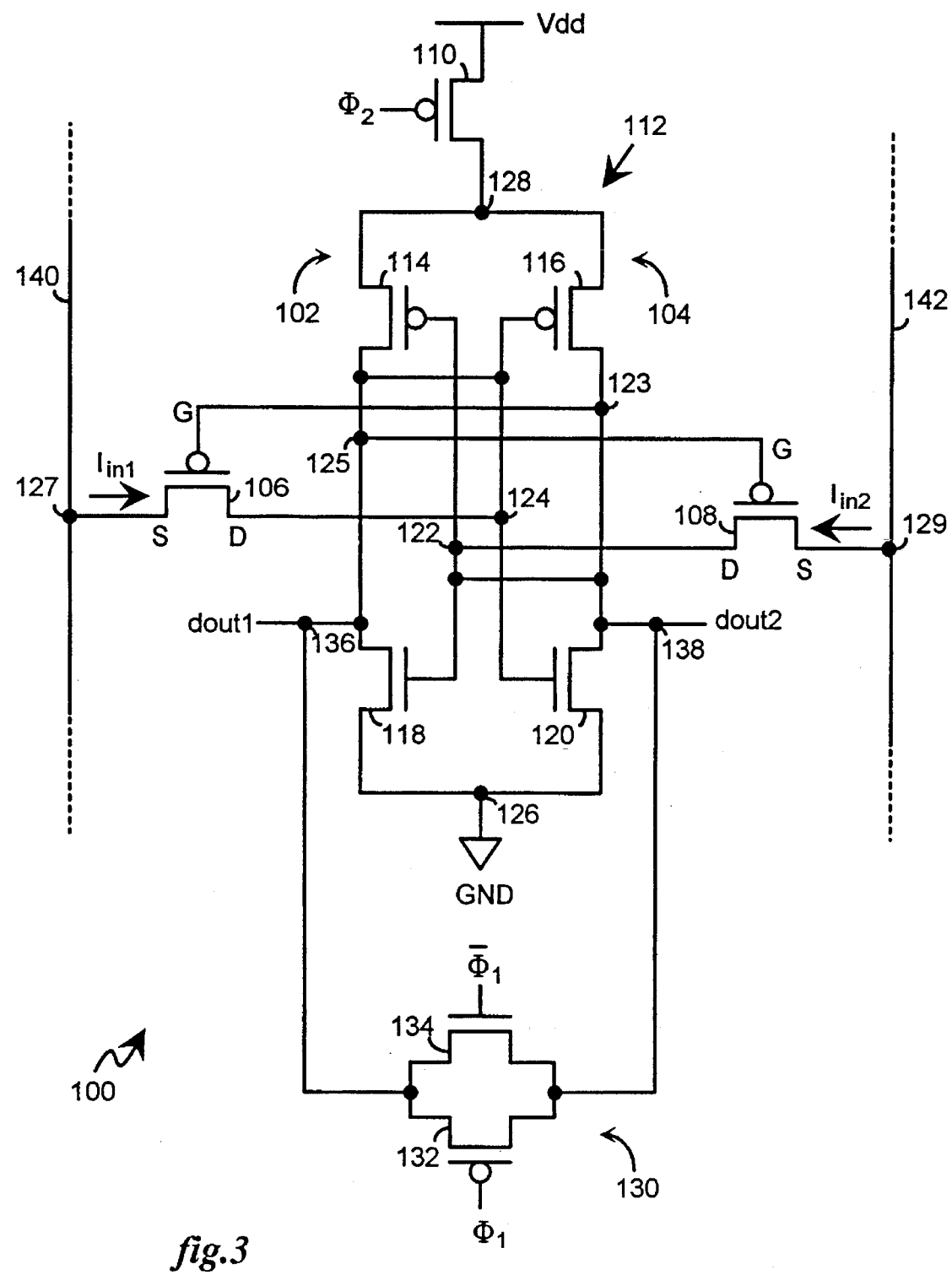
FIG. 3 illustrates, as an example, a preferred latch-type current sense amplifier circuit utilizing aspects of the present invention.

FIG. 3 illustrates a latch-type current sense amplifier circuit 100 preferably used when first and second data lines, 140 and 142, are precharged to a high voltage level such as Vdd before sensing. The sense amplifier circuit 100 receives first and second current inputs, $I_{in1}$ and $I_{in2}$, and generates, in response to control signals, $\Phi_1$ and $\Phi_2$, first and second complementary latched data outputs, dout1 and dout2, having logic states determined by a difference between the first and second current inputs, $I_{in1}$ and $I_{in2}$, and voltage levels determined by high and low reference voltages, Vdd and GND. The sense amplifier circuit 100 receives the first and second current inputs, $I_{in1}$ and $I_{in2}$, respectively via the first and second data lines, 140 and 142, typically from an analog circuit (e.g., 808 in FIG. 8), such as a memory cell; and the sense amplifier circuit 100 provides the first and second latched data outputs, dout1 and dout2, respectively via first and second output data lines (e.g., data bus 802 in FIG. 8), typically to a digital circuit, such as a microprocessor (e.g., 806 in FIG. 8).

The heart of the current sense amplifier circuit 100 is a latch circuit 112 including first and second inverters, 102 and 104, respectively. The first inverter 102 includes a p-mos transistor 114 and a n-mos transistor 118, wherein a source of the p-mos transistor 114 acts as a high voltage reference input of the first inverter 102, a source of the n-mos transistor 118 acts as a low reference voltage input of the first inverter 102, drains of the p-mos transistor 114 and the n-mos transistor 118 are connected together to form an output 125 of the first inverter 102, and gates of the p-mos transistor 114 and the n-ms transistor 118 are connected together to form an input 122 of the first inverter 102. In a similar fashion, the second inverter 104 includes a p-mos transistor 116 and a n-mos transistor 120, wherein a source of the p-mos transistor 116 acts as a high voltage reference input of the second inverter 104, a source of the n-mos transistor 120 acts as a low voltage reference input of the second inverter 104, drains of the p-mos transistor 116 and the n-mos transistor 120 are connected together to form an output 123 of the second inverter 104, and gates of the p-mos transistor 116 and the n-mos transistor 120 are connected together to form an input 124 of the second inverter 104.

The first and second inverters, 102 and 104, are termed "cross-coupled" inverters, because the input 122 of the first inverter 102 is connected to the output 123 of the second inverter 104, and the input 124 of the second inverter 104 is connected to the output 125 of the first inverter 102. The latch circuit 112 including the cross-coupled inverters, 102 and 104, has first and second inputs, 124 and 122, and first and second outputs, 125 and 123, wherein the first input 124 of the latch circuit 112 is the same as the input 124 of the second inverter 104, the second input 122 of the latch circuit 112 is the same as the input 122 of the first inverter 102, the first output 125 of the latch circuit 112 is the same as the output of the first inverter 102 and provides the first data output dout1, and the second output 123 of the latch circuit 112 is the same as the output of the second inverter 104 and provides the second data output dout2. The first and second outputs, 125 and 123, of the latch circuit 112 are termed a "complementary pair", because when the first output 125 (dout1) stabilizes at a HIGH logic state determined by a high reference voltage such as Vdd applied to a high reference node 128 connecting the high reference inputs (e.g., sources of p-mos transistors 114 and 116) of the first and second inverters, 102 and 104, the second output 123 (dout2) stabilizes at a LOW logic state determined by a low reference voltage such as GND applied to a low reference node 126 connecting the low reference inputs (e.g., sources of n-mos transistors 118 and 120) of the first and second inverters, 102 and 104, and conversely, when the first output 125 (dout1) stabilizes at a LOW logic state determined by the low reference voltage applied to the low reference node 126, the second output 123 (dout2) stabilizes at a HIGH logic state determined by the high reference voltage applied to the high reference node 128.

A p-mos transistor 110 connects, in response to a second control signal $\Phi_2$ being active LOW, a high voltage reference Vdd to the high reference node 128 of the latch circuit 112. In particular, the source of the p-mos transistor 110 is connected to the high voltage reference Vdd, the gate of the p-mos transistor 110 is connected to the second control signal $\Phi_2$, and the drain of the p-mos transistor 110 is connected to the high reference node 128 of the latch circuit 112. Although a complementary n-mos transistor may also be included in the sense amplifier circuit 100 to connect, in response to the second control signal $\Phi_2$ being active LOW, the low voltage reference GND to the low reference node 126 of the latch circuit 112, it is generally preferable not to include such a complementary n-mos transistor. One reason that it is preferable not to include such a complementary n-mos transistor is that its elimination allows an initial differential voltage indicative of a difference between the first and second current inputs, $I_{in1}$ and $I_{in2}$, to develop on the first and second inputs, 124 and 122, of the latch circuit, just prior to activating the second control signal $\Phi_2$. By allowing such an initial differential voltage to build-up before activating the second control signal $\Phi_2$, the latch circuit 112 generates the first and second data outputs, dout1 and dout2, respectively at its first and second outputs, 125 and 123, faster than without such initial differential voltage build-up.

P-mos transistors 106 and 108 provide the first and second current inputs, $I_{in1}$ and $I_{in2}$, respectively to the first and second inputs, 124 and 122, of the latch circuit 112. The p-mos transistor 106 has a source connected at node 127 to the first data line 140 for receiving the first current input $I_{in1}$, a drain connected to the first input 124 of the latch circuit 112 for providing the first current input $I_{in1}$ to the first input 124 of the latch circuit 112, and a gate connected to the second output 123 of the latch circuit 112 for automatically adjusting the current $I_{in1}$ passing through the p-mos transistor 106. Similarly, the p-mos transistor 108 has a source connected at node 129 to the second data line 142 for receiving the second current input $I_{in2}$, a drain connected to the second input 122 of the latch circuit 112 for providing the second current input $I_{in2}$ to the second input 122 of the latch circuit 112, and a gate connected to the first output 125 of the latch circuit 112 for automatically adjusting the current $I_{in2}$ passing through the p-mos transistor 108.

A transmission gate circuit 130 including a p-mos transistor 132 and a n-mos transistor 134, equalizes, in response to a first control signal $\Phi_1$ being active LOW, voltages on the first and second data outputs, dout1 and dout2. In particular, when the first control signal $\Phi_1$ is active LOW, the p-mos transistor 132 and the n-mos transistor 134 are both turned on, thus shorting (i.e., electrically connecting) nodes 136 and 138 together, and when the first control signal $\Phi_1$ is inactive HIGH, the p-mos transistor 132 and the n-mos transistor 134 are both turned off, thus isolating (i.e., electrically disconnecting) nodes 136 and 138 from each other.

Figure 6:
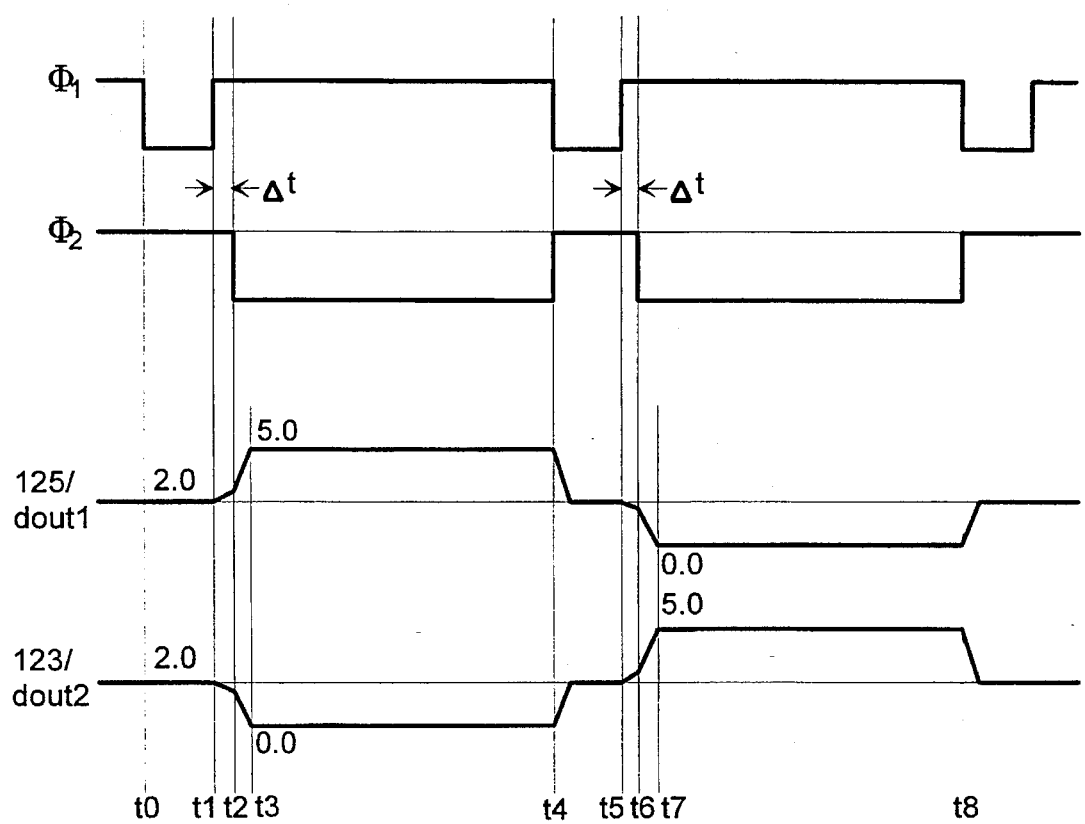
FIG. 6 illustrates, as examples, timing diagrams for the control signals to and outputs of the preferred latch-type current sense amplifier circuit of FIG. 3 utilizing aspects of the present invention.

FIG. 6 illustrates, as examples, simplified timing diagrams for the first control signal $\Phi_1$, the second control signal $\Phi_2$, and the first and second output voltages dout1 and dout2 respectively on nodes 125 and 123 of the latch-type current sense amplifier circuit 100 of FIG. 3. Between times t1 and t3, the current flowing through the data line 140 is larger than the current flowing through the data line 142, and between times t5 and t7, the current flowing through the data line 140 is smaller than the current flowing through the data line 142.

As shown in FIG. 6, timing of the first and second control signals, $\Phi_1$ and $\Phi_2$, are preferably such that at a time t0 the first control signal $\Phi_1$ is activated LOW to equalize the voltages on the first and second outputs, 125 and 123, of the latch circuit 112. At the same time, for example, a select circuit (not shown) connects the first and second data lines, 140 and 142, to an analog element, for example, which connection causes current to flow in the first and second input data lines, 140 and 142. Since the voltages on the first and second data lines, 140 and 142, have been precharged, for example, to 5.0 volts prior to time t0, and the first and second outputs, 125 and 123, are equalized, for example, to 2.0 volts at time t0, the p-mos transistors 106 and 108 are generally in saturated conducting states and the n-mos transistors 118 and 120 are generally turned on (assuming that their threshold voltages are less than 1.0 volts) during the time period between t0 and t1. However, since the first and second outputs, 125 and 123, of the latch circuit 112 are cross-coupled respectively to the second and first inputs, 124 and 122, of the latch circuit 112, input capacitances, $C_{IN2}$ and $C_{IN1}$, corresponding to the second and first inputs, 124 and 122, are charged up to 2.0 volts when the first and second outputs, 125 and 123, are equalized, to 2.0 volts, and held at that voltage as long the first and second outputs, 125 and 123, are forced to be equal to that voltage. As a consequence, very little input current $I_{in1}$ flows through the p-mos transistor 106 and the n-mos transistor 118 during the time period between t0 and t1, and very little input current $I_{in2}$ flows through the p-mos transistor 108 and the n-mos transistor 120 during the time period between t0 and t1.

Between times t1 and t2, the latch-type current sense amplifier circuit 100 operates in a voltage-developing mode, wherein it generates or develops a differential voltage across the first and second data outputs, dout1 and dout2, which is indicative of a difference between the first and second data line currents, $I_{DL1}$ and $I_{DL2}$. At time t1, the transmission gate 130 turns off, thereby allowing voltages on the first and second outputs, 123 and 125, to change and consequently, voltages on the input capacitances, $C_{IN1}$ and $C_{IN2}$, to change. Assuming that the input capacitances, $C_{IN1}$ and $C_{IN2}$, are equal, and that the current flowing through the first data line 140 is larger than the current flowing through the second data line 142 at time t1, then the first input current $I_{in1}$ is initially proportionately larger than the second input current $I_{in2}$ and as a consequence, a voltage V124 across the input capacitance $C_{IN1}$ corresponding to the first input 124 builds up faster than a voltage V122 across the input capacitance $C_{IN2}$ corresponding to the second input 122.

Although both voltages being generated at the first and second input nodes, 124 and 122, of the latch circuit 112 try to drive their respective inverter outputs, 123 and 125, towards a LOW logic state, only the output corresponding to the higher of the voltages, V124 or V122, is driven towards that state. In particular, a contention situation occurs wherein the larger or stronger of the two voltages, V124 and V122, overpowers the smaller or weaker of the two voltages. For example, at time t1, the first data line current $I_{DL1}$ is larger than the second data line current $I_{DL2}$, therefore the voltage generated on the first input node 124 is greater than the voltage generated on the second input node 122 and as a consequence, the voltage generated on the first input node 124 overpowers the voltage generated on the second input node 122, and the first data output dout1 is pulled up to the high reference voltage Vdd while the second data output dout2 is forced down to the low reference voltage Gnd.

It is significant that at time t1, both p-mos transistors 106 and 108 are in saturated conducting states and consequently, have characteristics such as described in reference to FIGS. 2a–2d. For example, as long as the p-mos transistors 106 and 108 are in saturation, the p-mos transistors 106 and 108 serve to minimize the effects of the high input impedances of the latch circuit 112 and as a consequence, cause their respective input currents, $I_{in1}$ and $I_{in2}$, to be higher than when the p-mos transistors 106 and 108 are not in saturation. In particular, as long as the p-mos transistors 106 and 108 are in saturation, they are characterized by low input impedances and high output impedances, which are respectively approximately equal to:

$$Z_{in} \approx 1/g_m \quad (3)$$

$$Z_{out} \approx r_{ds} \gg 1/g_m \quad (4)$$

where where $g_m$ is the transconductance of the p-mos transistors, 106 and 108, and $r_{ds}$ is the drain to source resistance of the p-mos transistors, 106 and 108.

P-mos transistors 106 and 108 are in saturated conducting states as long as their source, drain, and gate voltages satisfy the following equation required for saturation:

$$0 > V_{gs} - V_{th} > V_{ds} \quad (5)$$

where $V_{gs}$ is the gate-source voltage, $V_{th}$ is the threshold voltage, and $V_{ds}$ is the drain-source voltage of the p-mos transistors 106 and 108.

At time t1 immediately after deactivating the first control signal $\Phi_1$, the voltages on the input data lines 140 and 142 are equal since they have been precharged by some means such as a bit-line equalization circuit (not shown) prior to initiation of current sensing, and the voltages on the data outputs are equal since they have been equalized just prior to time t1 by the transmission gate 130. As an example, if the high voltage reference Vdd is 5.0 volts, the threshold voltages of p-mos transistors 106 and 108 are −1.0 volts, and the input data lines have been precharged to the high voltage reference Vdd, then it can be shown that equation (5) is satisfied at time t1 for both p-mos transistors 106 and 108 and accordingly, both p-mos transistors 106 and 108 are in saturation.

The p-mos transistors 106 and 108, however, generally do not remain in saturation after time t1. In particular, as the latch-type current sense amplifier circuit 100 generates its latched complementary data outputs, dout1 and dout2, one of the p-mos transistors, 106 or 108, will turn off, and the other will generally operate in its linear or triode region. For example, after time t2, the latch-type current sense amplifier circuit 100 will generate its complementary data outputs, dout1 and dout2, such that one of the data outputs, dout1 or dout2, will be pulled up to the high reference voltage Vdd, while the other, dout2 or dout1, will be pulled down to the low reference voltage Gnd. If the high reference voltage Vdd is 5.0 volts, the low reference voltage is 0.0 volts, the threshold voltages of the p-mos transistors 106 and 108 are −1.0 volts, the voltage on the first input data line is 5.0 volts, and the voltage on the second input data line is 4.6 volts, then it can be shown that the p-mos transistor 108 turns off and the p-mos transistor 106 stays on, but in its linear region. Conversely, if the high reference voltage Vdd is 5.0 volts, the low reference voltage is 0.0 volts, the threshold voltages of the p-mos transistors 106 and 108 are −1.0 volts, the voltage on the first input data line is 4.6 volts, and the voltage on the second input data line is 5.0 volts, then it can be shown that the p-mos transistor 106 turns off and the p-mos transistor 108 stays on, but in its linear region.

Accordingly, the p-mos transistors 106 and 108 act as self-regulating inputs for the latch-type current sense amplifier circuit 100. Initially, at time t1, they act to respectively reduce input impedances of the latch-type current sense amplifier circuit 100 in the manner as described in reference to FIGS. 2a–d, thereby causing more of the input data line currents to flow into the latch-type current sense amplifier circuit 100 and as a consequence, allowing the latch-type current sense amplifier circuit 100 to more quickly sense current differences between the first and second input currents, $I_{in1}$ and $I_{in2}$. Subsequently, after adequately charging up input nodes, 124 and 122, of the latch circuit 112, they automatically change their conductive states to speed up the latching of the complementary data outputs, dout1 and dout2, by the latch circuit 112 in response to the voltages thus generated on the input nodes, 124 and 122, of the latch circuit 112. In particular, because of the feedback connections from the outputs, 123 and 125, of the latch circuit 112 to respective gates of the p-mos transistors 106 and 108, the p-mos transistor, 106 or 108, which is providing the smaller of the two input currents, $I_{in1}$ and $I_{in2}$, to the sense amplifier circuit 100 is forced to turn off, thereby speeding up the latching of the data outputs, dout1 and dout2, by eliminating the above described contention situation in the latch circuit 116, and the other of the p-mos transistors, 108 or 106, is forced to operate in its linear or triode region, thereby allowing the high data output, dout1 or dout2, connected to the drain of that p-mos transistor, 108 or 106, to swing to the high reference voltage Vdd.

Figure 4:
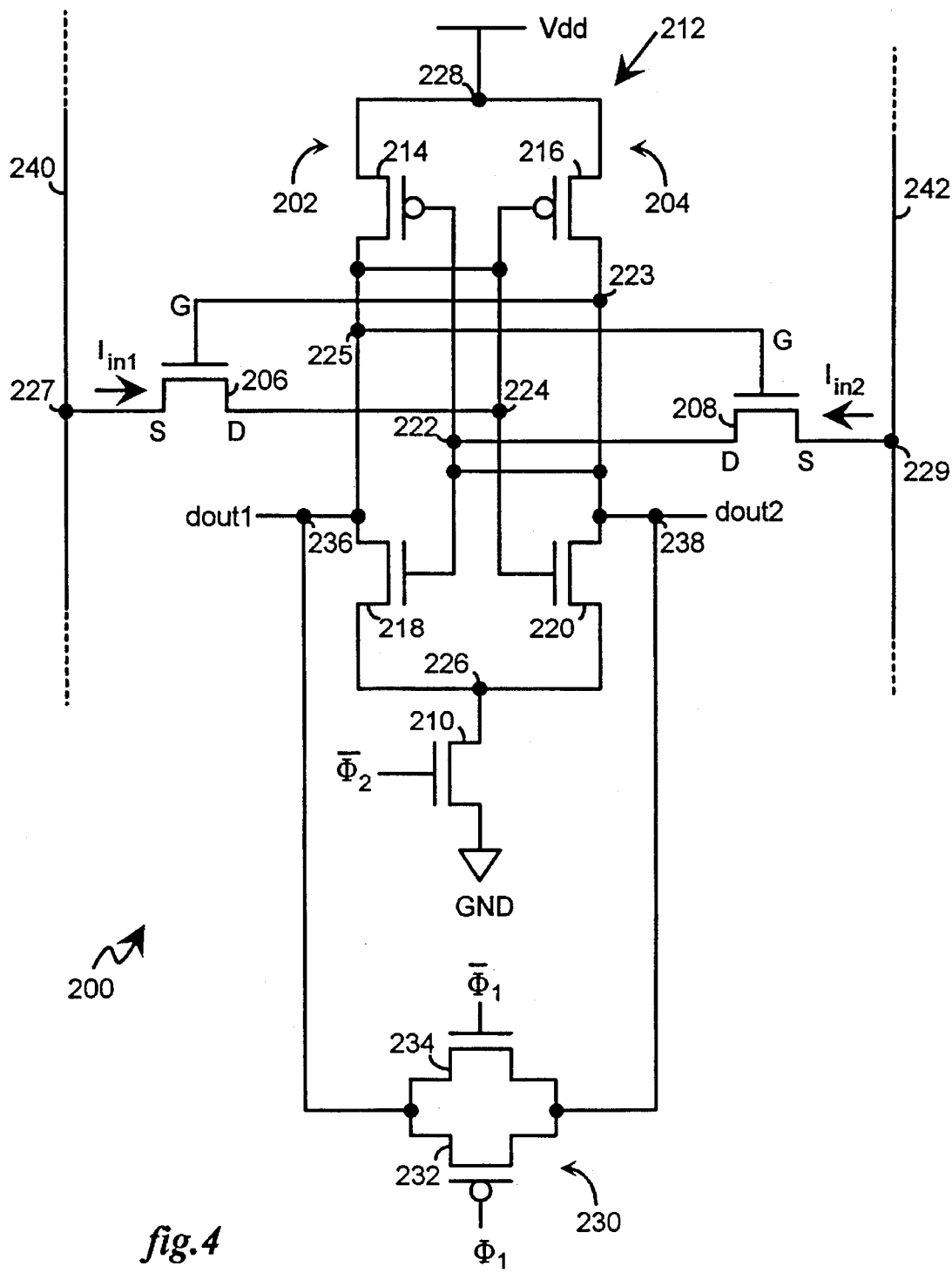
FIG. 4 illustrates, as an example, a first alternative latch-type current sense amplifier circuit utilizing aspects of the present invention.

FIG. 4 illustrates, as an example, a first alternative latch-type current sense amplifier circuit 200 preferably used when first and second data lines, 240 and 242, are precharged to a low voltage level such as GND before sensing. Since the latch-type current sense amplifier circuit 200 functions in a similar manner to the latch-type current sense amplifier circuit 100, redundant details in their two descriptions will generally be avoided. In order to operate in a similar manner as the latch-type current sense amplifier circuit 100 when the first and second data lines, 240 and 242, are precharged to a low voltage level such as GND before sensing, the latch-type current sense amplifier circuit 200 substitutes n-mos transistors 206, 208, and 210 for their p-mos transistor counterparts 106, 108 and 110 in the latch-type current sense amplifier circuit 100. In particular, the n-mos transistor 206 of the latch-type current sense amplifier circuit 200 replaces and performs the same function as the p-mos transistor 106 of the latch-type current sense amplifier circuit 100, the n-mos transistor 208 of the latch-type current sense amplifier circuit 200 replaces and performs the same function as the p-mos transistor 108 of the latch-type current sense amplifier circuit 100, and the n-mos transistor 210 of the latch-type current sense amplifier circuit 200 replaces and performs the same function as the p-mos transistor 110 of the latch-type current sense amplifier circuit 100.

Figure 7:
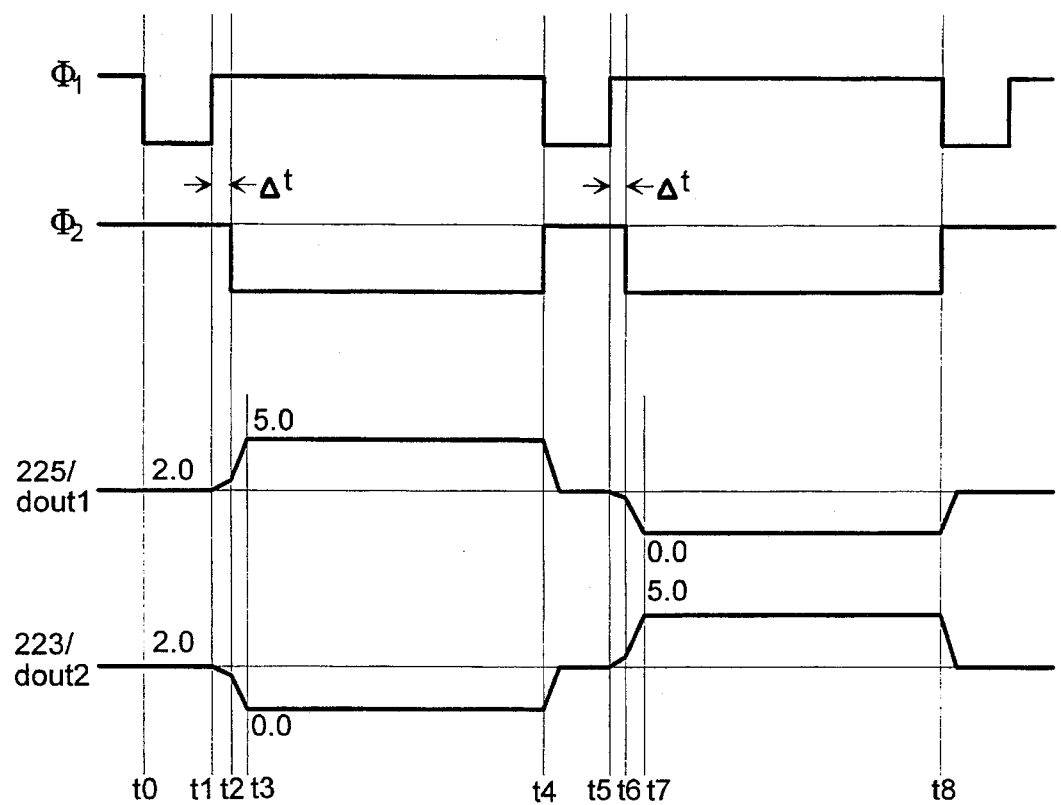
FIG. 7 illustrates, as examples, timing diagrams for the control signals to and outputs of the first alternative latch-type current sense amplifier circuit of FIG. 4 utilizing aspects of the present invention.

FIG. 7 illustrates, as examples, simplified timing diagrams for the first control signal $\Phi_1$, the second control signal $\Phi_2$, and the first and second output voltages dout1 and dout2 respectively on nodes 225 and 223 of the latch-type current sense amplifier circuit 200 of FIG. 4. Between times t1 and t3, the current flowing through the data line 240 is larger than the current flowing through the data line 242, and between times t5 and t7, the current flowing through the data line 240 is smaller than the current flowing through the data line 242.

As shown in FIG. 7, timing of the first and second control signals, $\Phi_1$ and $\Phi_2$, for controlling the first alternative latch-type current sense amplifier circuit 200 is essentially the same as for controlling the preferred latch-type current sense amplifier circuit 100. In particular, at a time t0 the first control signal $\Phi_1$ is activated LOW to equalize the voltages on the first and second outputs, 225 and 223, of the latch circuit 212. Subsequently, at a time t1, the first control signal $\Phi_1$ is deactivated HIGH to allow the first and second outputs, 225 and 223, of the latch circuit 212 to respond to voltages being initially developed at the first and second inputs, 224 and 222, of the latch circuit 212 in response to the first and second input currents, $I_{in1}$ and $I_{in2}$. Thereafter, at a time t2 preferably following a delay Δt after time t1, the second control signal $\Phi_2$ is activated LOW in order to generate and latch the complementary logic level data outputs, dout1 and dout2, respectively at the first and second outputs, 225 and 223, of the latch circuit 212, such that the complementary logic level data outputs, dout1 and dout2, are indicative of a difference between the first and second data line currents, $I_{DL1}$ and $I_{DL2}$.

At time t1, like their p-mos transistor counterparts of the latch-type current sense amplifier circuit 100, it can be shown that the n-mos transistors 206 and 208 of the latch-type current sense amplifier circuit 200 are also in saturated conducting states. In particular, n-mos transistors 206 and 208 are in saturated conducting states as long as their source, drain, and gate voltages satisfy the following equation required for saturation:

$$0 < V_{gs} - V_{th} < V_{ds} \tag{6}$$

where $V_{gs}$ is the gate-source voltage, $V_{th}$ is the threshold voltage, and $V_{ds}$ is the drain-source voltage of the n-mos transistors 206 and 208.

At time t1 immediately after deactivating the first control signal $\Phi_1$, the voltages on the input data lines 240 and 242 are equal since they have been precharged by some means such as a bit-line equalization circuit (not shown) prior to initiation of current sensing, and the voltages on the data outputs are equal since they have been equalized just prior to time t1 by the transmission gate 230 which functions in a same manner as its counterpart in the latch-type current sense amplifier circuit 100. As an example, if the low voltage reference Gnd is 0.0 volts, the threshold voltages of n-mos transistors 206 and 208 are 1.0 volts, and the input data lines have been precharged to the low voltage reference Gnd, then it can be shown that equation (6) is satisfied at time t1 for both n-mos transistors 206 and 208 and accordingly, both n-mos transistors 206 and 208 are in saturation.

Also like their p-mos transistor counterparts of the latch-type current sense amplifier circuit 100, the n-mos transistors 206 and 208 of the latch-type current sense amplifier circuit 200 also generally do not remain in saturation after time t1. In particular, as the latch-type current sense amplifier circuit 200 generates its latched complementary data outputs, dout1 and dout2, one of the n-ms transistors, 206 or 208, will turn off, and the other will generally operate in its linear or triode region. For example, after time t2, the latch-type current sense amplifier circuit 200 will generate its complementary data outputs, dout1 and dout2, such that one of the data outputs, dout1 or dout2, will be pulled up to Vdd, while the other, dout2 or dout1, will be pulled down to Gnd. If the high reference voltage Vdd is 5.0 volts, the low reference voltage is 0.0 volts, the threshold voltages of the n-mos transistors 206 and 208 are 1.0 volts, the voltage on the first input data line is 0.4 volts, and the voltage on the second input data line is 0.0 volts, then it can be shown that the n-mos transistor 206 turns off and the n-mos transistor 208 stays on, but in its linear region. Conversely, if the high reference voltage Vdd is 5.0 volts, the low reference voltage is 0.0 volts, the threshold voltages of the n-ms transistors 206 and 208 are 1.0 volts, the voltage on the first input data line is 0.0 volts, and the voltage on the second input data line is 0.4 volts, then it can be shown that the n-mos transistor 208 turns off and the n-mos transistor 206 stays on, but in its linear region.

Accordingly, like their p-mos transistor counterparts of the latch-type current sense amplifier circuit 100, the n-mos transistors 206 and 208 act as self-regulating inputs for the latch-type current sense amplifier circuit 200. Initially, at time t1, they act to respectively reduce input impedances of the latch-type current sense amplifier circuit 200 in the manner as described in reference to FIGS. 2a–d, thereby causing more of the input data line currents to flow into the latch-type current sense amplifier circuit 200 and as a consequence, allowing the latch-type current sense amplifier circuit 200 to more quickly sense current differences between the first and second input currents, $I_{in1}$ and $I_{in2}$. Subsequently, after adequately charging up input nodes, 224 and 222, of the latch circuit 212, they automatically change their conductive states to speed up the latching of the complementary data outputs, dout1 and dout2, by the latch circuit 212 in response to the voltages thus generated on the input nodes, 224 and 222, of the latch circuit 212 in the same manner as previously described in reference to the p-mos transistors 106 and 108 of the latch-type current sense amplifier circuit 100.

Figure 5A:
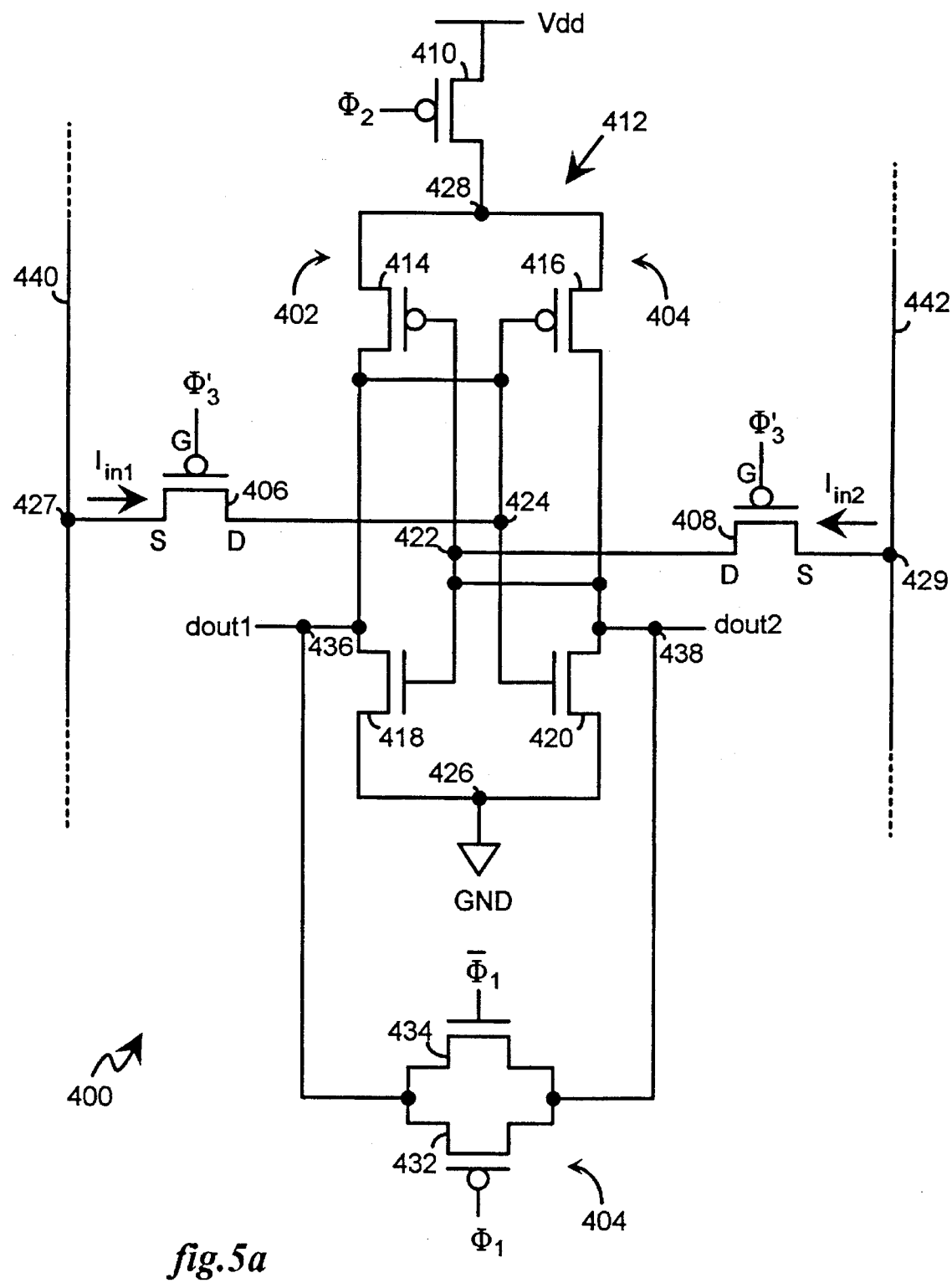
FIG. 5a illustrates, as an example, a second alternative latch-type current sense amplifier circuit utilizing aspects of the present invention.

FIG. 5a illustrates, as an example, a second alternative latch-type current sense amplifier circuit 400 preferably used when first and second data lines, 440 and 442, are precharged to a high voltage level such as Vdd before sensing. In many respects, the latch-type current sense amplifier circuit 400 functions in a similar manner to the latch-type current sense amplifier circuit 100, therefore redundant details in their two descriptions will generally be avoided. A key difference between the latch-type current sense amplifier circuit 400 and the latch-type current sense amplifier circuit 100, is that the gates of p-mos transistors 406 and 408 are not connected in a feedback fashion to the outputs of the latch-type current sense amplifier circuit 400, such as their counterparts are in the latch-type current sense amplifier circuit 100. Instead, the gates of the p-mos transistors 406 and 408 are controlled by a third control signal $\Phi_3$. Accordingly, the turning on and off of the p-mos transistors 406 and 408 are controlled in an open-loop fashion through logic generating the third control signal $\Phi_3$, rather than automatically through feedback such as in the latch-type current sense amplifier circuit 100.

Figure 5B:
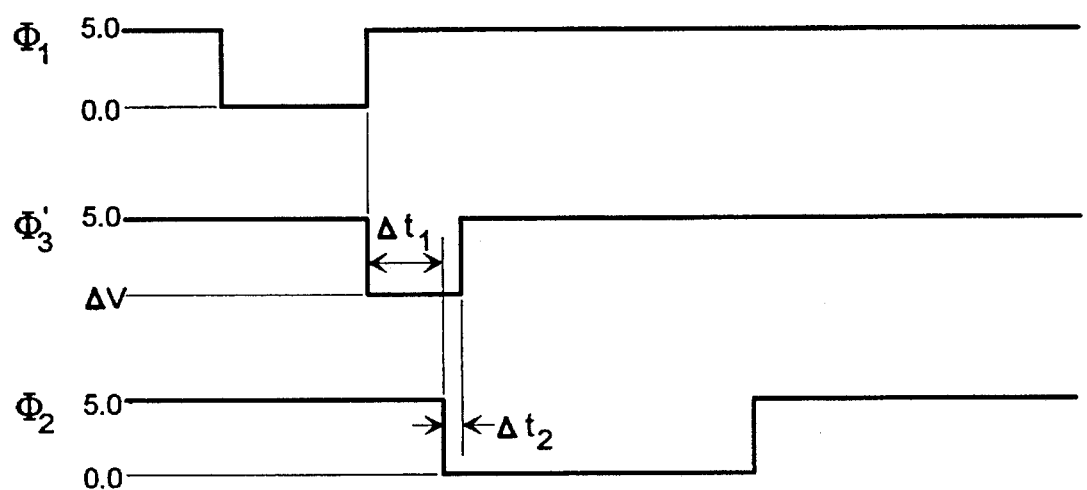

FIG. 5b illustrates, as examples, timing diagrams for the first control signal $\Phi_1$, the second control signal $\Phi_2$, and the third control signal $\Phi'_3$ to be provided to the latch-type current sense amplifier circuit 400. To ensure that the p-mos transistors 406 and 408 are in saturated conductive states when turned on, the gates of the p-mos transistors 406 and 408 are driven by the third control signal $\Phi_3'$ which has a voltage $\Delta V$ equal to approximately one diode voltage drop for its active LOW state. Timing of the first, second, and third control signals, $\Phi_1$, $\Phi_2$, and $\Phi'_3$, are such that the third control signal $\Phi'_3$ is activated LOW preferably shortly before or concurrently with the deactivation of the first control signal $\Phi_1$, and the second control signal $\Phi_2$ is activated LOW preferably before the deactivation of the third control signal $\Phi'_3$. To ensure that the latch-type sense amplifier circuit 400 latches to the correct state, the second control signal $\Phi_2$ is activated after a time delay $\Delta t_1$ following the activation of the third control signal $\Phi'_3$. To ensure that the input/output nodes, 424 and 422, are not left floating by the third control signal $\Phi'_3$ being inadvertently deactivated prior to the activation of the second control signal $\Phi_2$, the third control signal $\Phi'_3$ is deactivated after a time delay $\Delta t_2$ following the activation of the second control signal $\Phi_2$.

Although not shown, a third alternative latch-type current sense amplifier circuit may be formed by replacing the p-mos transistors 406, 408 and 410 of the second alternative latch-type current sense amplifier circuit 400, with n-mos transistors in a similar fashion as the first alternative latch-type current sense amplifier circuit 200 did with respect to the preferred latch-type current sense amplifier circuit 100. As still another alternative, the second alternative latch-type current sense amplifier circuit 400 may be modified such that the gates of p-mos transistors 406 and 408 are independently controlled by separate rather than the same control signal.

Figure 8:
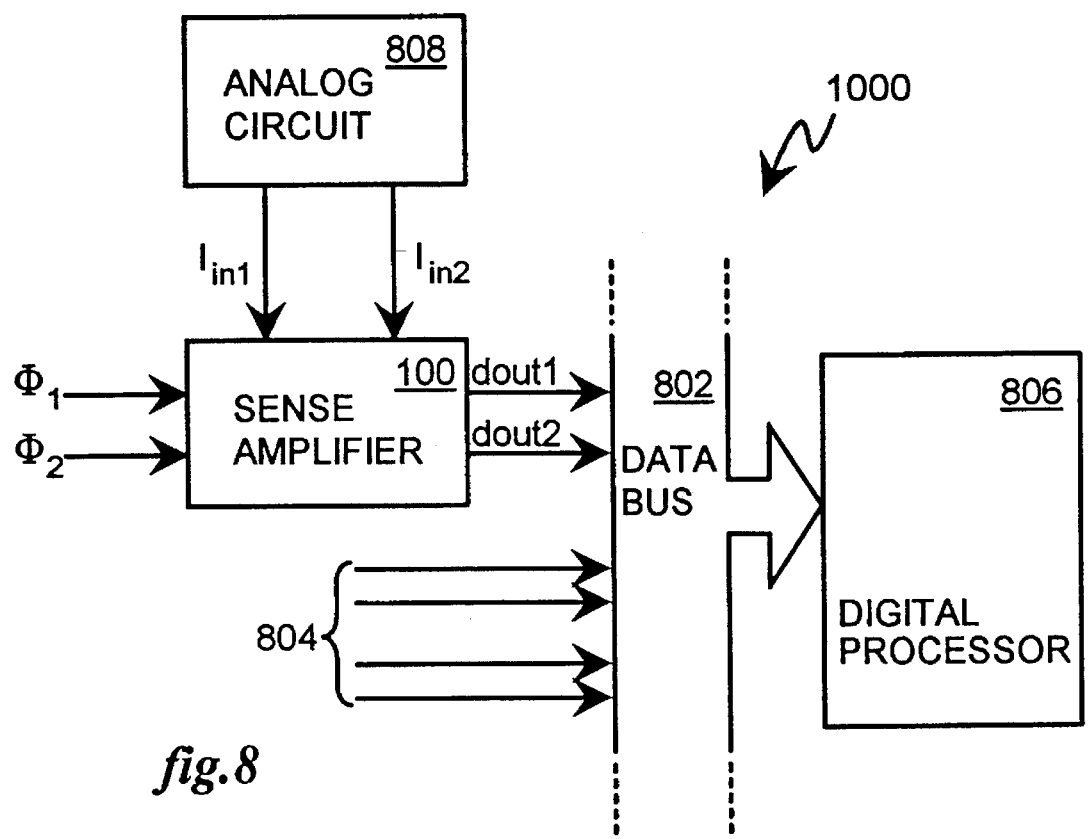
FIG. 8 illustrates, as an example, a block diagram of a microprocessor system including a latch-type current sense amplifier circuit, utilizing aspects of the present invention.

FIG. 8 illustrates, as an example, a computer system 1000 including the latch-type current sense amplifier circuit 100 (or an alternative latch-type sense amplifier circuit utilizing aspects of the present invention), an analog circuit 808, a digital processor 806, and a data bus 802. The latch-type current sense amplifier circuit 100 (or an alternative latch-type sense amplifier circuit utilizing aspects of the present invention) receives first and second input currents, $I_{in1}$ and $I_{in2}$, from the analog circuit 808, and first and second control signals, $\Phi_1$ and $\Phi_2$, from a control signal generator unit (not shown). The latch-type current sense amplifier circuit 100 (or an alternative latch-type sense amplifier circuit utilizing aspects of the present invention) then generates in response of such received inputs, first and second latched data outputs, dout1 and dout2, in a similar manner as described in reference to FIGS. 2–8, and provides such first and second latched data outputs, dout1 and dout2, to the digital processor 806 via the data bus 802.

As an example, the first and second input currents, $I_{in1}$ and $I_{in2}$, may be provided by respective first and second bit lines of a bit line pair connected to a memory cell. In this case, the latch-type current sense amplifier circuit 100 (or an alternative latch-type sense amplifier circuit utilizing aspects of the present invention) preferably provides its latched logic level data outputs, dout1 and dout2, to respective tri-state drivers (not shown) of the data bus 802, which in turn, provide their outputs to the digital processor 806 when enabled by the digital processor 806. The digital processor 806, which may be any one of numerous commercially available microprocessors, such as the type manufactured by Intel and Motorola, then processes the latched data outputs, dout1 and dout2, received from the latch-type current sense amplifier circuit 100 (or an alternative latch-type sense amplifier circuit utilizing aspects of the present invention), along with other data outputs 804 received, for example, from one or more other circuits (not shown) in the computer system 1000.

As another example, the first and second input currents, $I_{in1}$ and $I_{in2}$, may be provided by respective first and second analog data lines, wherein the first analog data line is connected to a reference current and the second analog data line is connected to a current which is to be compared against the reference current. In this case, the latch-type current sense amplifier circuit 100 (or an alternative latch-type sense amplifier circuit utilizing aspects of the present invention) functioning as a comparator, may again provide its latched logic level data outputs, dout1 and dout2, to respective tri-state drivers (not shown) of the data bus 802, which in turn, provide their outputs to the digital processor 806 when enabled by the digital processor 806. The digital signal processor 806 then processes the latched data outputs, dout1 and dout2, received from the latch-type current sense amplifier circuit 100 (or an alternative latch-type sense amplifier circuit utilizing aspects of the present invention), along with other data outputs 804 received, for example, from one or more other circuits (not shown) in the computer system 1000.

Although the various aspects of the present invention have been described with respect to a preferred embodiment, it will be understood that the invention is entitled to full protection within the full scope of the appended claims.

What is claimed is:

1. A current sense amplifier circuit for generating a latched data output indicative of a difference between first and second input currents respectively received from first and second input data lines connected respectively at first and second nodes to said current sense amplifier circuit, said current sense amplifier circuit comprising:

latching means having a first latch input characterized by a first latch input impedance, a second latch input characterized by a second latch input impedance, and a first latch output, for generating said latched data output at said first latch output in response to first and second signals respectively received at said first and second latch inputs, first means connected between said first node and said first latch input, for receiving said first input current, generating said first signal from said first input current, and providing said first signal to said first latch input, wherein said first means in combination with said latching means is characterized at said first node, before said latched data output is generated at said first latch output of said latching means, by a first sense amplifier input impedance less than said first latch input impedance, and after said latched data output is generated at said first latch output of said latching means, by an impedance greater than said first latch input impedance if said first latched data output is a first logic state, or by an impedance substantially equal to said first latch input impedance if said first latched data output is a second logic state, and second means connected between said second node and said second latch input, for receiving said second input current, generating said second signal from said second input current, and providing said second signal to said second latch input, wherein said second means in combination with said latching means is characterized at said second node, before said latched data output is generated at said first latch output of said latching means, by a second sense amplifier input impedance less than said second latch input impedance, and after said latched data output is generated at said first latch output of said latching means, by an impedance greater than said second latch input impedance if said first latched data output is said second logic state, or by an impedance substantially equal to said second latch input impedance if said first latched data output is said first logic state.

2. The current sense amplifier circuit as recited in claim 1, wherein said latching means has a second latch output and generates a complementary latched data output at said second latch output, further comprising:

equalizing means responsive to a first control signal and connected between said first and second latch outputs, for substantially equalizing voltages respectively on said first and second latch outputs while said first control signal is activated.

3. The current sense amplifier circuit as recited in claim 2, wherein said latching means is coupled to a second control signal activated after a time delay following deactivation of said first control signal, to generate said latched data output.

4. The current sense amplifier circuit as recited in claim 3, wherein said latching means comprises:

cross-coupled first and second inverters coupled to said second control signal, wherein an output of said first inverter is connected to an input of said second inverter and an output of said second inverter is connected to an input of said first inverter, wherein said first and second latch inputs are respectively said inputs of said second and first inverters, and said first and second latch outputs are respectively said outputs of said first and second inverters.

5. The current sense amplifier circuit as recited in claim 4, wherein said first means comprises a first transistor having a source connected to said first node for receiving said first input current, a drain connected to said first latch input for providing said first signal to said latching means, and a gate connected to said second latch output.

6. The current sense amplifier circuit as recited in claim 5, wherein said second means comprises:

a second transistor having a source connected to said second node for receiving said second input current, a drain connected to said second latch input for providing said second signal to said latching means, and a gate connected to said first latch output.

7. The current sense amplifier circuit as recited in claim 6, wherein said first inverter of said latching means has a first voltage reference input, said second inverter of said latching means has a second voltage reference input, said first transistor of said first means is a first p-mos transistor, said second transistor of said second means is a second p-mos transistor, and further including a third p-mos transistor having a source connected to a high voltage reference, a drain connected to said first and second voltage reference inputs of said first and second inverters of said latching means, and a gate coupled to said second control signal.

8. The current sense amplifier circuit as recited in claim 6, wherein said first inverter of said latching means has a first voltage reference input, said second inverter of said latching means has a second voltage reference input, said first transistor of said first means is a first n-mos transistor, said second transistor of said second means is a second n-mos transistor, and further including a third n-mos transistor having a source connected to a low voltage reference, a drain connected to said first and second voltage reference inputs of said first and second inverters of said latching means, and a gate coupled to said second control signal.

9. The current sense amplifier circuit as recited in claim 3, wherein said first means includes a first transistor having a source, a drain, and a gate, said source of said first transistor connected to said first node for receiving said first input current, and said drain of said first transistor connected to said first latch input for providing said first current to said latching means, wherein said second means includes a second transistor having a source, a drain and a gate, said source of said second transistor connected to said second node for receiving said second input current, and said drain of said second transistor connected to said second latch input for providing said second input current to said latching means, and further comprising means for providing voltages to said gates of said first and second transistors such that said first and second transistors are initially in saturated conducting states when said second control signal is initially activated.

10. The current sense amplifier circuit as recited in claim 9, wherein said connected together gates of said p-mos and said n-mos transistors of said voltage providing means are coupled to a delayed version of said first control signal.

11. The current sense amplifier circuit as recited in claim 9, wherein said first inverter of said latching means has a first voltage reference input, said second inverter of said latching means has a second voltage reference input, said first transistor of said first means is a first p-mos transistor, said second transistor of said second means is a second p-mos transistor, and further including a third p-mos transistor having a source connected to a high voltage reference, a drain connected to said first and second voltage reference inputs of said first and second inverters of said latching means, and a gate coupled to said second control signal.

12. The current sense amplifier circuit as recited in claim 9, wherein said first inverter of said latching means has a first voltage reference input, said second inverter of said latching means has a second voltage reference input, said first transistor of said first means is a first n-mos transistor, said second transistor of said second means is a second n-mos transistor, and further including a third n-mos transistor having a source connected to a low voltage reference, a drain connected to said first and second voltage reference inputs of said first and second inverters of said latching means, and a gate coupled to said second control signal.

13. A current sense amplifier circuit generating latched complementary data outputs indicative of a difference between first and second input currents, comprising:

a latch circuit having first and second latch inputs, and first and second latch outputs, wherein said first latch output provides a first latched data output and said second latch output provides a second latched data output complementary to said first latched data output, a first transistor having a source, a drain, and a gate, said source receiving said first input current, said drain connected to said first latch input, and said gate connected to said second latch output, and a second transistor having a source, a drain, and a gate, said source receiving said second input current, said drain connected to said second latch input, and said gate connected to said first latch output.

14. The current sense amplifier circuit as recited in claim 13, further comprising equalizing means coupled to a first control signal for equalizing voltages respectively on said first and second latch outputs after said first control signal is activated.

15. The current sense amplifier circuit as recited in claim 14, wherein said latch circuit comprises a first inverter having an input and an output, and a second inverter having an input and an output, wherein said first and second latch inputs are respectively said inputs of said second and first inverters, and said first and second latch outputs are respectively said outputs of said first and second inverters.

16. The current sense amplifier circuit as recited in claim 15, wherein said first inverter of said latch circuit has a first voltage reference input, said second inverter of said latch circuit has a second voltage reference input, and further comprising switching means coupled to a second control signal for connecting a voltage reference to said first and second voltage reference inputs of said first and second inverters after said second control signal is activated.

17. The current sense amplifier circuit as recited in claim 16, wherein said first transistor is a first p-mos transistor, said second transistor is a second p-mos transistor, and said switching means includes a third p-mos transistor having a source connected to a high voltage reference, a drain connected to said said first and second voltage reference inputs of said first and second inverters, and a gate coupled to said second control signal.

18. The current sense amplifier circuit as recited in claim 16, wherein said first transistor is a first n-mos transistor, said second transistor is a second n-mos transistor, and said switching means includes a third n-mos transistor having a source connected to a low voltage reference, a drain connected to said said first and second voltage reference inputs of said first and second inverters, and a gate coupled to said second control signal.

19. A method of generating a latched data output and a complementary latched data output indicative of a difference between first and second current inputs, comprising:

equalizing, after a first control signal is activated, voltages respectively associated with first and second outputs of a latch circuit, deactivating said first control signal, and controllably passing said first and second current inputs respectively through first and second transistors initially in saturated conducting states, generating, from said passed first and second current inputs, said latched data output at a first output of said latch circuit and said complementary latched data output at a second output of said latch circuit, and controlling the passing of said first and second current inputs respectively through said first and second transistors such that said first transistor passes said first input current and said second transistor substantially stops passing said second current input when a latched data output having a first logic state is being generated at said first output of said latch circuit, and said second transistor passes said second input current and said first transistor substantially stops passing said first input current when a latched data output having a second logic state is being generated at said first output of said latch circuit.

20. The method as recited in claim 19, wherein said latched data output and complementary latched data output generating step comprises generating, from said passed first and second current inputs, after said second control signal is activated and after a time delay after said first control signal is deactivated, said latched data output at a first output of said latch circuit and said complementary latched data output at a second output of said latch circuit.

21. A method of forming a current sense amplifier circuit for generating a latched data output and a complementary latched data output indicative of a difference between first and second current inputs, comprising:

forming a latch by connecting an output of a first inverter to an input of a second inverter, and connecting an output of said second inverter to an input of said first inverter, connecting a source electrode of a first transistor to said first current input, connecting a drain electrode of said first transistor to said input of said second inverter, and connecting a gate electrode of said first to said output of said second inverter, and connecting a source electrode of a second transistor to said second current input, connecting a drain electrode of said second transistor to said input of said first inverter, and connecting a gate electrode of said second transistor to said output of said first inverter.

22. The method of forming a current sense amplifier circuit as recited in claim 21, further comprising connecting an equalizing circuit coupled to a first control signal across said first and second inverter outputs for equalizing respective voltages on said first and second inverter outputs when said first control signal is activated.

23. The method of forming a current sense amplifier circuit as recited in claim 21, further comprising connecting a switch coupled to a second control signal between a power source and said latch for connecting said power source to said latch when said second control signal is activated.

24. A computer system comprising:

a microprocessor, a data bus connected to said microprocessor, and a sense amplifier circuit connected to said data bus, wherein said sense amplifier circuit generates a latched data output indicative of a difference between first and second input currents respectively received from first and second input data lines connected respectively at first and second nodes to said current sense amplifier circuit, said current sense amplifier circuit including latching means having a first latch input characterized by a first latch input impedance, a second latch input characterized by a second latch input impedance, and a first latch output, for generating said latched data output at said first latch output in response to first and second signals respectively received at said first and second latch inputs, first means connected between said first node and said first latch input, for receiving said first input current, generating said first signal from said first input current, and providing said first signal to said first latch input, wherein said first means in combination with said latching means is characterized at said first node, before said latched data output is generated at said first latch output of said latching means, by a first sense amplifier input impedance less than said first latch input impedance, and after said latched data output is generated at said first latch output of said latching means, by an impedance greater than said first latch input impedance if said first latched data output is a first logic state, or by an impedance substantially equal to said first latch input impedance if said first latched data output is a second logic state, and second means connected between said second node and said second latch input, for receiving said second input current, generating said second signal from said second input current, and providing said second signal to said second latch input, wherein said second means in combination with said latching means is characterized at said second node, before said latched data output is generated at said first latch output of said latching means, by a second sense amplifier input impedance less than said second latch input impedance, and after said latched data output is generated at said first latch output of said latching means, by an impedance greater than said second latch input impedance if said first latched data output is said second logic state, or by an impedance substantially equal to said second latch input impedance if said first latched data output is said first logic state.

25. The computer system as recited in claim 24, wherein said latching means has a second latch output and generates a latched complementary data output at said second latch output, and said sense amplifier circuit further includes equalizing means coupled to a first control signal for equalizing voltages respectively on said first and second latch outputs after said first control signal is activated.

26. The computer system as recited in claim 25, wherein said latching means of said sense amplifier circuit is coupled to a second control signal activated after a time delay following deactivation of said first control signal, to generate said latched data output.

27. The computer system as recited in claim 26, wherein said latching means of said sense amplifier circuit includes cross-coupled first and second inverters coupled to said second control signal, wherein an output of said first inverter is connected to an input of said second inverter and an output of said second inverter is connected to an input of said first inverter, and wherein said first and second latch inputs are respectively said inputs of said second and first inverters, and said first and second latch outputs are respectively said outputs of said first and second inverters.

28. The computer system as recited in claim 27, wherein said first means of said sense amplifier circuit includes a first transistor having a source receiving said first input current, a drain connected to said input of said second inverter of said latching means, and a gate connected to said output of said second inverter of said latching means, and said second means of said sense amplifier circuit includes a second transistor having a source receiving said second input current, a drain connected to said input of said first inverter of said latching means, and a gate connected to said output of said first inverter of said latching means.

29. The computer system as recited in claim 28, wherein said first inverter of said latching means has a first voltage reference input, said second inverter of said latching means has a second voltage reference input, said first transistor of said first means is a first p-mos transistor, said second transistor of said second means is a second p-mos transistor, and further including a third p-mos transistor having a source connected to a high voltage reference, a drain connected to said first and second voltage reference inputs of said first and second inverters of said latching means, and a gate coupled to said second control signal.

30. The computer system as recited in claim 28, wherein said first inverter of said latching means has a first voltage reference input, said second inverter of said latching means has a second voltage reference input, said first transistor of said first means is a first n-mos transistor, said second transistor of said second means is a second n-mos transistor, and further including a third n-mos transistor having a source connected to a low voltage reference, a drain connected to said first and second voltage reference inputs of said first and second inverters of said latching means, and a gate coupled to said second control signal.

31. The computer system as recited in claim 27, wherein said first means of said sense amplifier circuit includes a first transistor having a source, a drain and a gate, said source receiving said first input current, said drain connected to said input of said second inverter of said latching means, said second means of said sense amplifier circuit includes a second transistor having a source, a drain and a gate, said source receiving said second input current, said drain connected to said input of said first inverter of said latching means, and said sense amplifier circuit further includes means for providing voltages to said gates of said first and second transistors such that said first and second transistors are initially in saturated conducting states.

32. The computer system as recited in claim 31, wherein said connected together gates of said p-mos transistor and said n-mos transistor are coupled to a delayed version of said first control signal.

33. A computer system comprising:

a microprocessor, a data bus connected to said microprocessor, and a sense amplifier circuit connected to said data bus, wherein said sense amplifier circuit generates a latched data output indicative of a difference between first and second input currents, and said sense amplifier circuit includes a latch circuit including a first inverter having an input and an output, and a second inverter having an input and an output, wherein said output of said first inverter is connected at a first node to said input of said second inverter, and said output of said second inverter is connected at a second node to said input of said first inverter, a first transistor having a source, a drain, and a gate, said source receiving said first input current, said drain connected to said input of said second inverter, and said gate connected to said output of said second inverter, and a second transistor having a source, a drain, and a gate, said source receiving said second input current, said drain connected to said input of said first inverter, and said gate connected to said output of said first inverter.

34. The computer system as recited in claim 33, wherein said sense amplifier circuit further includes equalizing means coupled to a first control signal for equalizing voltages respectively on said first and second nodes after said first control signal is activated.

35. The computer system as recited in claim 34, wherein said first inverter of said latch circuit of said sense amplifier circuit has a first voltage reference input, said second inverter of said latch circuit of said sense amplifier circuit has a second voltage reference input, and said sense amplifier circuit further includes switching means coupled to a second control signal for connecting a voltage reference to said first and second voltage reference inputs of said first and second inverters after said second control signal is activated.

36. The computer system as recited in claim 35, wherein said first transistor is a first p-mos transistor, said second transistor is a second p-mos transistor, and said switching means includes a third p-mos transistor having a source connected to a high voltage reference, a drain connected to said said first and second voltage reference inputs of said first and second inverters, and a gate coupled to said second control signal.

37. The computer system as recited in claim 35, wherein said first transistor is a first n-mos transistor, said second transistor is a second n-mos transistor, and said switching means includes a third n-mos transistor having a source connected to a low voltage reference, a drain connected to said said first and second voltage reference inputs of said first and second inverters, and a gate coupled to said second control signal.

* * * * *